(12) United States Patent
Douglas

(10) Patent No.: US 11,263,191 B2
(45) Date of Patent: Mar. 1, 2022

(54) METHOD AND SYSTEM FOR STORING AND RETRIEVING MULTI-DIMENSIONAL DATA

(71) Applicant: Pointerra Technologies Pty Ltd, Subiaco (AU)

(72) Inventor: Shane Douglas, Subiaco (AU)

(73) Assignee: Pointerra Technologies Pty Ltd, Subiaco (AU)

( * ) Notice: Subject to any disclaimer, the term of this patent is extended or adjusted under 35 U.S.C. 154(b) by 287 days.

(21) Appl. No.: 16/329,263

(22) PCT Filed: Aug. 31, 2017

(86) PCT No.: PCT/AU2017/050937
§ 371 (c)(1),
(2) Date: Feb. 28, 2019

(87) PCT Pub. No.: WO2018/039730
PCT Pub. Date: Mar. 8, 2018

(65) Prior Publication Data
US 2019/0220453 A1    Jul. 18, 2019

(30) Foreign Application Priority Data

Aug. 31, 2016   (AU) .............................. 2016903463

(51) Int. Cl.
*G06F 16/22*      (2019.01)
*G06F 16/901*     (2019.01)
*H03M 7/40*       (2006.01)

(52) U.S. Cl.
CPC ...... *G06F 16/2264* (2019.01); *G06F 16/2237* (2019.01); *G06F 16/2246* (2019.01); *G06F 16/9027* (2019.01); *H03M 7/40* (2013.01)

(58) Field of Classification Search
CPC ............. G06F 16/2264; G06F 16/9027; G06F 16/2237; G06F 16/2246; H03M 7/40
See application file for complete search history.

(56) References Cited

U.S. PATENT DOCUMENTS 5,857,036 A * 1/1999 Barnsley ................. G06T 9/001
382/248
7,167,856 B2   1/2007 Lawder
(Continued)

FOREIGN PATENT DOCUMENTS

CN          102437855         5/2012
WO     WO-2014094047 A1 *  6/2014 ........... G06T 17/005
(Continued)

OTHER PUBLICATIONS

Fang et al., "Deformable volume rendering by 3D texture mapping and octree encoding", VIS '96: Proceedings of the 7th conference on Visualization '96Oct. 1996 p. 73-ff. (Year: 1996).*
(Continued)

*Primary Examiner* — Mark D Featherstone
*Assistant Examiner* — Kweku William Halm

(57) ABSTRACT

A method of storing multi-dimensional data, the method comprises encoding a structure of nodes of a tree data structure into an order representation; compressing data of nodes of the tree data structure to create a data stream of compressed data portions of variable length in a sequence corresponding to the order represented in the order representation. Each compressed data portion is formed from the data of each node. The method further comprises mapping the positions of the data portions in the data stream to the order representation to produce a location representation; and storing the order representation, data stream and location representation. A system of storing multi-dimensional data is also disclosed, as well as a method and system for retrieving stored multi-dimensional data.

25 Claims, 6 Drawing Sheets

(56) References Cited

U.S. PATENT DOCUMENTS

| | | | |
|---|---|---|---|
| 8,610,605 B2 | 12/2013 | Froemmgen | |
| 2003/0106009 A1* | 6/2003 | Jarchi | H03M 13/152 714/755 |
| 2004/0128479 A1* | 7/2004 | Madduri | G06F 9/3816 712/210 |
| 2004/0150639 A1* | 8/2004 | Park | G06T 9/40 345/419 |
| 2008/0198047 A1* | 8/2008 | Niemi | H03M 7/40 341/67 |
| 2010/0030861 A1* | 2/2010 | Oertel | H04N 21/23 709/206 |
| 2012/0197895 A1* | 8/2012 | Isaacson | G06F 16/164 707/738 |
| 2013/0054495 A1* | 2/2013 | Hawkins | G06N 20/20 706/12 |
| 2013/0226885 A1* | 8/2013 | Ottaviano | G06F 16/9027 707/693 |
| 2014/0122921 A1* | 5/2014 | Imamichi | G06F 16/2228 714/6.2 |
| 2016/0094242 A1* | 3/2016 | Ackerman | H03M 7/46 341/51 |

FOREIGN PATENT DOCUMENTS

| | | |
|---|---|---|
| WO | WO 2018/039730 | 3/2018 |
| WO | WO 2014/094047 | 4/2021 |

OTHER PUBLICATIONS

International Preliminary Report on Patentability dated Mar. 5, 2019 From the International Bureau of WIPO Re. Application No. PCT/AU2017/050937. (5 Pages).

International Search Report and the Written Opinion dated Nov. 9, 2017 From the International Searching Authority Re. Application No. PCT/AU2017/050937. (8 Pages).

Lefebvre et al. "Compressed Random-Access Trees for Spatially Coherent Data", Proceedings of the 18th Eurographics Conference on Rendering Techniques, EGSR '07, Grenoble, France, Jun. 25-27, 2007, p. 339-349, Jun. 25, 2007.

Grossi et al. "Design of Practical Succinct Data Structures for Large Data Collections", International Symposium on Experimental Algorithms SEA, Experimental Algorithms: May 17, 2013.

* cited by examiner

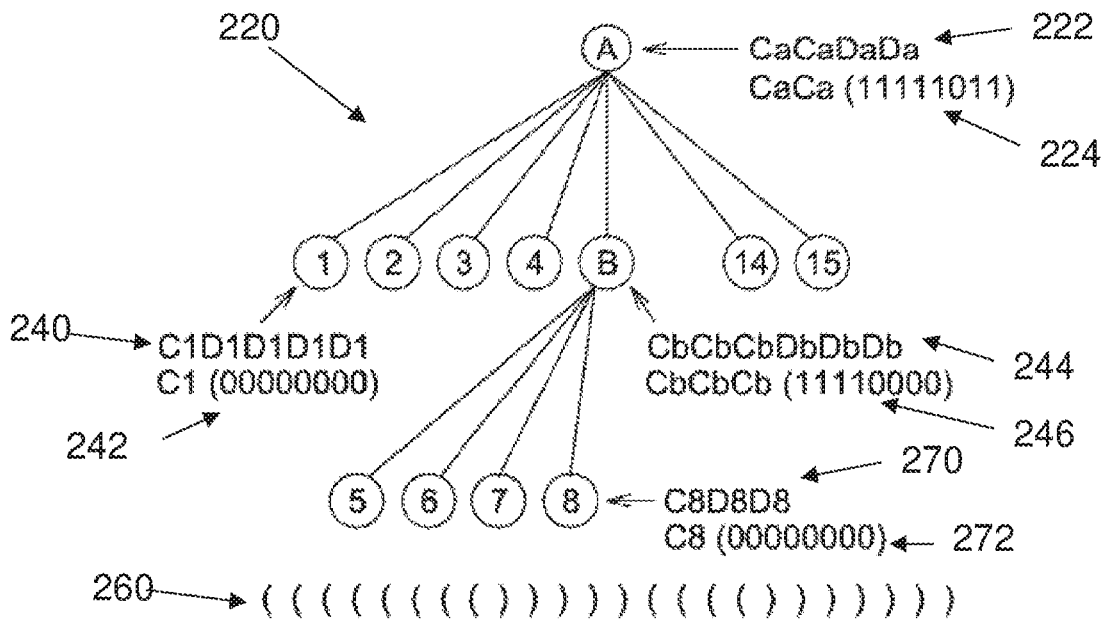
FIG 5
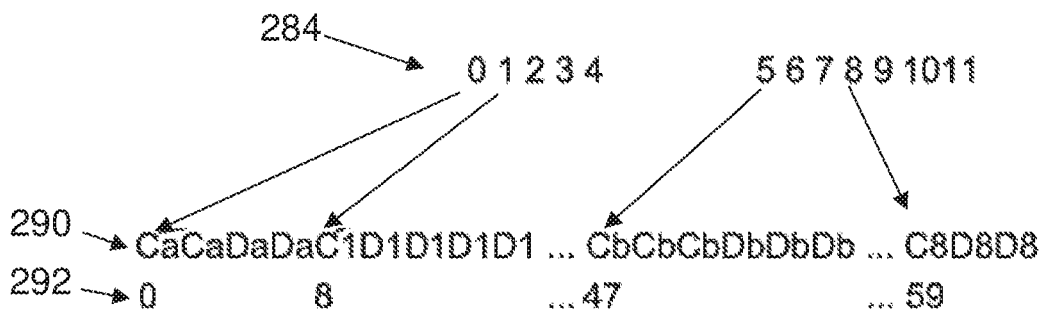
FIG 6
FIG 7

METHOD AND SYSTEM FOR STORING AND RETRIEVING MULTI-DIMENSIONAL DATA

RELATED APPLICATIONS

This application is a National Phase of PCT Patent Application No. PCT/AU2017/050937 having International filing date of Aug. 31, 2017, which claims the benefit of priority of Australian Patent Application No. 2016903463 filed on Aug. 31, 2016. The contents of the above applications are all incorporated by reference as if fully set forth herein in their entirety.

FIELD AND BACKGROUND OF THE INVENTION

The present invention relates to a method for storing and retrieving multi-dimensional data and a system for storing and retrieving multi-dimensional data.

A known method of structuring data, such as data representing computer graphic objects, is a hierarchical tree structure, such as a quadtree, or an octree. A quadtree is based on successive subdivision of a computer graphics object into four equally sized quadrants which are subdivided again until a desired level of decomposition is reached. Thus allowing a variable resolution data structure. The quad tree is used for 2-dimensional data, and this concept is extended to represent 3-dimensional data in an octree, which is a cube divided into eight octants which are recursively subdivided into a further eight octants until a predetermined level of decomposition is reached.

The standard implementation of a spatial partitioning data structure, such as an octree or a quadtree, can be inefficient in storage of the data. This is particularly so when the multi-dimensional data is sparsely defined spatial data because the memory (storage space) overhead for maintaining parent-to-child pointers is significant with respect to the amount of data in each tree node as outlined in a Pacific Graphics 2009 paper by Choi, Ju, Chang, Lee and Kim, Linkless octrees using multi-level perfect hashing. This technique can result in considerable amounts of memory being required for the pointers, which can end up being larger than the actual octree data.

Additionally, a second known method of achieving data storage and retrieval is by storing the data in a predetermined sequence. This also has drawbacks, as it usually means the octree has to be navigated in the predetermined sequence order to access the data in it, that is, it is not randomly accessible.

There are succinct data storage techniques of tree data structures, but these rely on the data being of fixed, known size for all nodes of the tree.

When there are large amounts of data it is desirable to compress the data, particularly when the features of interest in the data are sparsely distributed. However compression typically creates variable sized compressed data where random access is not available. The alternative is to compress the whole data structure. When the whole data structure is compressed, in order to access data, the entire structure must be decompressed, which is against the purpose of storing and retrieving data in an efficient manner.

It would be advantageous if a more efficient method for storing and retrieving multi-dimensional data could be provided which overcomes the problems discussed above.

Any references to documents that are made in this specification are not intended to be an admission that the information contained in those documents form part of the common general knowledge known to a person skilled in the field of the invention, unless explicitly stated as such.

SUMMARY OF THE INVENTION

According to an aspect of the invention, there is provided a method of storing multi-dimensional data, the method comprising:
encoding a structure of nodes of a tree data structure into an order representation;
compressing data of nodes of the tree data structure to create a data stream of compressed data portions of variable length in a sequence corresponding to the order represented in the order representation, wherein each compressed data portion is formed from the data of each node; mapping the positions of the data portions in the data stream to the order representation to produce a location representation;
storing the order representation, data stream and location representation.

According to an embodiment of the invention, the order representation is in the form of a bit vector.

According to an embodiment of the invention, the location representation is encoded for storing.

According to an embodiment of the invention, the tree data structure includes node structural information prior to compressing of the data of the nodes. According to an embodiment of the invention, the data portions comprise node structural information. In an embodiment the node structural information in the created data portions comprise the presence or absence of child nodes to that node. According to an embodiment of the invention, the compressing of the data of the nodes of the tree data structure uses statistical encoding to create the data stream. In an embodiment the statistical encoding is Huffman encoding.

According to an embodiment of the invention, the bit vector is encoded using a succinct data structure technique. According to an embodiment of the invention, the succinct data structure technique for encoding the ordering of nodes is a depth-first unary degree sequence succinct data structure technique. According to an embodiment of the invention, the depth-first unary degree sequence succinct data structure technique comprises concatenating in depth-first order the tree data structure using a balanced bit representation. In an embodiment the balanced bit representation forms the bit vector.

According to an embodiment of the invention, the position of the node in the bit vector is mapped to the position of the data portion in the data stream.

According to an embodiment of the invention, the mapping of the data portions in the data stream comprises determining the position in the data stream of the location of each data portion. In an embodiment each location is determined as the position in the data stream of the beginning of the respective data portion. In an embodiment, the locations of the positions of the node are encoded in node order as the location representation. In an embodiment, the encoding uses an Elias-Fano representation of monotone sequences.

According to an embodiment of the invention, the tree data structure is an octree data structure.

According to an embodiment of the invention, a desired node of data can be accessed from the data stream by:
determining the sequence position in the data stream of the desired node from the order representation, wherein the position of the data portion in the data stream can be determined from the location representation; and the data can be decompressed from its determined position in the data stream. According to an embodiment of the invention, the presence of child nodes of the decompressed node can be determined from structural information decompressed from the data portion. According to an embodiment of the invention, the sequence of present child nodes of the decompressed node can be determined from structural information decompressed from the data portion. In an embodiment the sequence of child nodes corresponds to the order of nodes represented in the order representation. Thus a tree structure can be navigated by navigating down nodes of the tree.

According to an embodiment of the invention, the position of the desired node in the tree structure can be determined from the order representation and node structural information decompressed from the data portion.

According to another aspect of the invention, there is provided a method of retrieving multi-dimensional data, the method comprising:

receiving an identifier of a node of tree data to be retrieved; providing a stored data tree comprising a data stream of a plurality of data portions, where each data portion is of a variable size and comprises compressed data of a node of the data tree;

providing a data order representation of a sequence of nodes in the stored data tree;

providing a location representation which represents the position of the variable length data portions in the data stream in sequence order;

decoding the bit vector data order representation to identify a sequence position of the identified node in the sequence of data portions in the data stream;

determining the location in the data stream of the identified node from the decoded position in the sequence and the location representation;

accessing the data portion at the determined location within the data stream;

decompressing the accessed data portion to obtain decompressed data of the identified node.

In an embodiment of the invention, the data order representation is in the form of a bit vector.

According to another aspect of the invention, there is provided a method of retrieving multi-dimensional data, the method comprising:

receiving an identifier of a node of tree data structure to be retrieved;

decoding a bit vector data order representation to identify a sequence position of the identified node in a sequence of data portions in a data stream of data portions, each data portion being compressed node data;

determining a location in the data stream of the identified node from the decoded position in the sequence and a location representation which represents the position of the variable length data portions in the data stream in sequence order;

accessing the data portion at the determined location within the data stream;

decompressing the accessed data portion to obtain decompressed data of the identified node.

According to an embodiment of the invention, the decompression of the data of the identified node occurs without decompressing the entirety of the data stream.

According to an embodiment of the invention, the decompression of the data is performed on discrete locations within the data stream.

According to an embodiment of the invention, the method further comprises decoding the location representation to produce the positions of the variable length data portions in the data stream. In an embodiment the decoding comprises retrieving a first bit sequence and a second bit sequence according to the identifier and concatenating the first and second bit sequences to form the bit vector, which represents the respective position of the variable length data position of the identified node. In an embodiment the decoding comprises reversing an Elias-Fano representation of monotone sequences of the location representation.

According to an embodiment of the invention, the method further comprises extracting child node information from the decompressed data portion. According to an embodiment of the invention, the method further comprises combining the extracted child node information with the sequence order of the nodes to determine the position of child nodes of the decompressed node in the data tree structure. According to an embodiment of the invention, the presence of child nodes of the decompressed node can be determined from child node information. In an embodiment, the sequence of child nodes corresponds to the order of nodes represented in the data order representation. According to an embodiment, the position of a child node in the tree structure forms an identifier of a further node to be retrieved.

According to an embodiment of the invention, the method further comprises combining node position information in the decompressed data portion with the identified sequence position of the node to determine the position of the decompressed data in the data tree structure.

According to another aspect of the invention, there is provided a system of storing and retrieving multi-dimensional data, the system comprising:

a processing unit in communication with a storage device for storing data, wherein the processing unit is arranged to:

encode a structure of nodes of a tree data structure into an order representation; compress data of nodes of the tree data structure to create a data stream of compressed data portions of variable length in a sequence corresponding to the order represented in the order representation, wherein each compressed data portion is formed from the data of each node;

map the positions of the data portions in the data stream to the order representation to produce a location representation; and store the order representation, data stream and location representation in the storage device.

According to another aspect of the invention, there is provided a system of storing and retrieving multi-dimensional data, the system comprising:

a processing unit in communication with a storage device for storing data, wherein the processing unit comprises:

an encoding module configured to encode a structure of nodes of a tree data structure into an order representation;

a compression module configured to compress data of nodes of the tree data structure to create a data stream of compressed data portions of variable length in a sequence corresponding to the order represented in the order representation, wherein each compressed data portion is formed from the data of each node;

a mapping module configured to map the positions of the data portions in the data stream to the order representation to produce a location representation; and a storage module configured to store the order representation, data stream and location representation in the storage device.

According to another aspect of the invention, there is provided a system for storing and retrieving multi-dimensional data, the system comprising means for encoding a structure of nodes of a tree data structure into an order representation;

means for compressing data of nodes of the tree data structure to create a data stream of compressed data portions of variable length in a sequence corresponding to the order represented in the order representation, wherein each compressed data portion is formed from the data of each node; means for mapping the positions of the data portions in the data stream to the order representation to produce a location representation; and means for storing the order representation, data stream and location representation.

According to another aspect of the invention, there is provided a computer program executable by a computer embodied on a computer readable media, and the computer program comprises instructions for controlling the computer to:

encode a structure of nodes of a tree data structure into an order representation; compress data of nodes of the tree data structure to create a data stream of compressed data portions of variable length in a sequence corresponding to the order represented in the order representation, wherein each compressed data portion is formed from the data of each node; map the positions of the data portions in the data stream to the order representation to produce a location representation; and store the order representation, data stream and location representation.

According to another aspect of the invention, there is provided a system of storing and retrieving multi-dimensional data, the system comprising:

a processing unit in communication with a storage device for retrieving data, wherein the processing unit is arranged to:

receive an identifier of a node of tree data structure to be retrieved;

decode a data order representation to identify a sequence position of the identified node in a sequence of data portions in a data stream of data portions, each data portion being compressed node data;

determine a location in the data stream of the identified node from the decoded position in the sequence and a location representation which represents the position of the variable length data portions in the data stream in sequence order;

access the data portion at the determined location within the data stream;

decompress the accessed data portion to obtain decompressed data of the identified node.

According to another aspect of the invention, there is provided a system of storing and retrieving multi-dimensional data, the system comprising:

a processing unit in communication with a storage device for retrieving data, wherein the processing unit comprises:

a receiver for receiving an identifier of a node of tree data structure to be retrieved; a decoder for decoding a data order representation to identify a sequence position of the identified node in a sequence of data portions in a data stream of data portions, each data portion being compressed node data;

a module for determining a location in the data stream of the identified node from the decoded position in the sequence and a location representation which represents the position of the variable length data portions in the data stream in sequence order;

a module for accessing the data portion at the determined location within the data stream;

a decompression module for decompressing the accessed data portion to obtain decompressed data of the identified node.

According to another aspect of the invention, there is provided a system for storing and retrieving multi-dimensional data, the system comprising receiving an identifier of a node of tree data structure to be retrieved;

means for decoding a data order representation to identify a sequence position of the identified node in a sequence of data portions in a data stream of data portions, each data portion being compressed node data;

means for determining a location in the data stream of the identified node from the decoded position in the sequence and a which represents the position of the variable length data portions in the data stream in sequence order location representation;

means for accessing the data portion at the determined location within the data stream; means for decompressing the accessed data portion to obtain decompressed data of the identified node.

According to another aspect of the invention, there is provided a computer program executable by a computer embodied on a computer readable media, and the computer program comprises instructions for controlling the computer to:

receive an identifier of a node of tree data structure to be retrieved;

decode a data order representation to identify a sequence position of the identified node in a sequence of data portions in a data stream of data portions, each data portion being compressed node data;

determine a location in the data stream of the identified node from the decoded position in the sequence and a location representation which represents the position of the variable length data portions in the data stream in sequence order;

access the data portion at the determined location within the data stream;

decompress the accessed data portion to obtain decompressed data of the identified node.

Throughout the specification and claims, unless the context requires otherwise, the word "comprise" or variations such as "comprises" or "comprising", will be understood to imply the inclusion of a stated integer or group of integers but not the exclusion of any other integer or group of integers.

BRIEF DESCRIPTION OF THE SEVERAL VIEWS OF THE DRAWINGS

In order to provide a better understanding of the present invention embodiments will now be described by way of example only, with reference to the drawings, in which:—

FIG. 5 illustrates encoding of an octree structure using a Depth-First Unary Degree Sequence (DFUDS) succinct data structure method according to an embodiment of the present invention;

FIG. 6 illustrates encoding/decoding of an octree data structure according to an embodiment of the present invention;

FIG. 7 illustrates compression of stored octree data according to an embodiment of the present invention;

DESCRIPTION OF SPECIFIC EMBODIMENTS OF THE INVENTION

Figure 1:
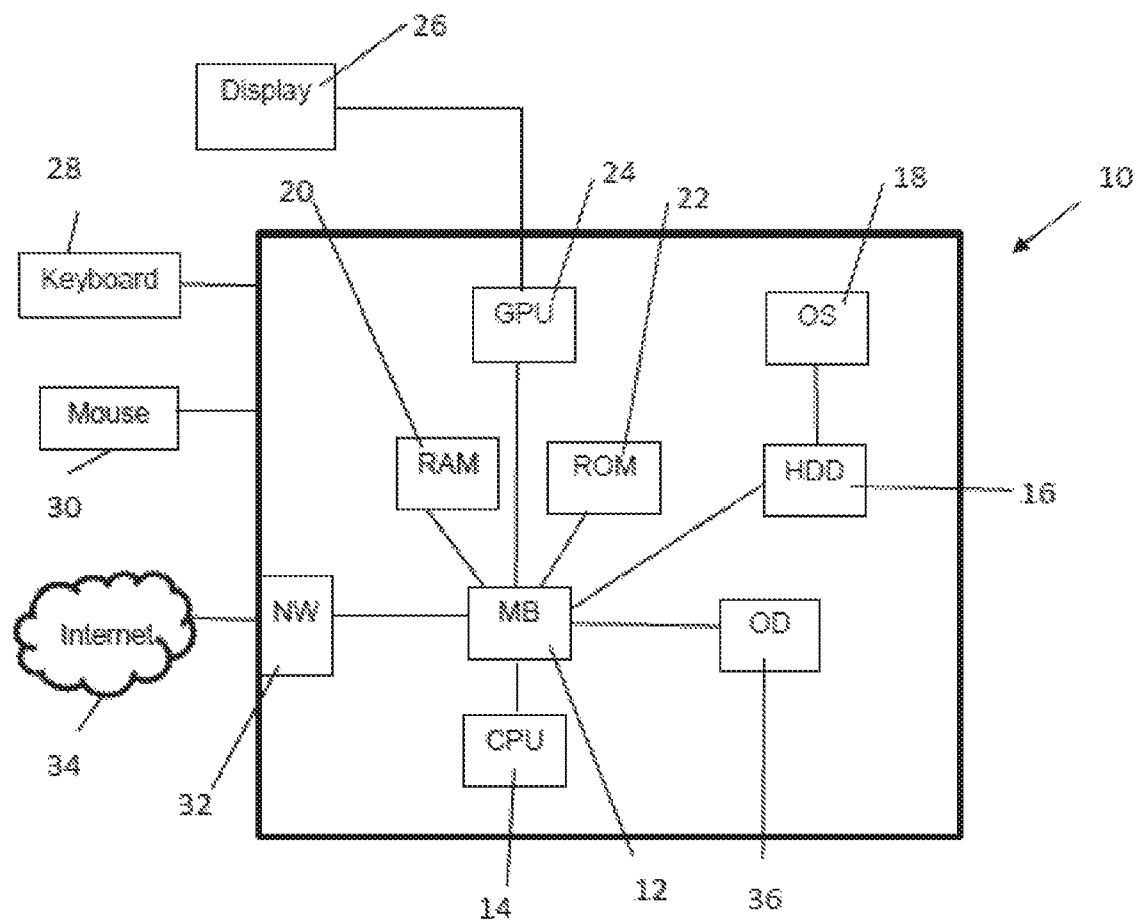
FIG. 1 shows a system for storing and or retrieving a data tree according to an embodiment of the present invention.
Figure 2:
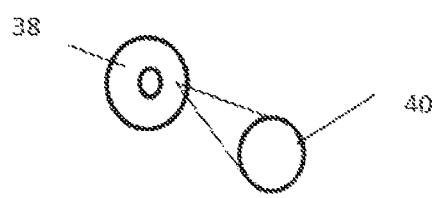
FIG. 2 illustrates a non-transient computer program for performing a method according to an embodiment of the present invention.

FIG. 1 shows a block diagram of a typical computer system 10 for carrying out a method of storing and retrieving multi-dimensional data according to the present invention. The computer system 10 may be for example, virtual machine computer, a personal computer, a gaming console, a tablet, a smart phone or a dedicated computing system, such as for example, a medical imaging device.

In an embodiment the computer system 10 comprises a central processing unit based system for carrying out the method. The system 10 comprises a mother board 12 which is capable of powering and interfacing to at least one central processing unit 14. The central processing unit 14 may be configured to have a plurality of discrete processors or processors with multiple processing cores. Examples of the central processing unit are the Xeon™ or Core™ series of processors manufactured by Intel Corporation or the FX™ series of processors manufactured by Advanced Micro Devices Inc.

A storage drive 16 is interfaced to the motherboard 12. The storage drive 16 may comprise one or more typical storage drives, such as by way of example, hard disk drives or solid state drives. An operating system 18 is stored in the storage drive 16 in order to provide instructions to the computer system 10. The motherboard 12 is also in communication with a random access memory (RAM) 20. The RAM 20 is typically used as temporary storage and working space for the operating system. A central processing unit 14 is in communication with the motherboard 12 as well.

A graphics processor unit 24 is interfaced to the motherboard 12. The graphics processor unit 24 may also be arranged so as to be integrated to the motherboard 12 or the central processing unit 14.

The motherboard 12 may include a network interface module 32, such as by way of example, a local area network adaptor or a wireless network adaptor. The network interface module 32 allows the computer system 10 to connect to a computer network 34, such as by way of example, the Internet. The computer program 40 described below, or data for the computer program 40 may be obtained from the computer network 34 or from a non-transitory computer readable storage medium 38 accessed through an interface device 36.

A user is able to interact with the computer system 10 by means of peripherals, such as by way of example, a keyboard 28, a mouse 30 and a display screen 26. The display screen 26 may be of any suitable type, such as by way of example, a liquid crystal display, a light emitting diode display or a cathode ray tube display. The graphics processor unit 24 controls the images displayed on the display screen 26. The computer system 10 is configured by modules, which may comprise sub-modules, which interact with and exchange data to perform the present invention. The modules may be implemented in hardware, that is as electronic circuits, or in the form of functional arrangements 500 implemented by instructions that control the Central Processor Unit(s) (CPU(s)) and/or the Graphics Processor Unit(s) (GPU(s)) in cooperation with or as a part of the operating system. The control instructions are commonly referred to as computer program(s) 40. The computer program 40 is embodied in the non-transitory computer readable medium 38, such as a permanent optical, magnetic or other electronic storage medium.

The computer program 40 is installed upon the computer system 10. In an embodiment, the computer program 40 configures the system 10 as a plurality of functional modules 500 described further below in relation to FIG. 10 which operate in an embodiment to preform one or both of the methods described in relation to FIGS. 8 and 9 further below. The computer program 40 may be regarded as the data generator 520 and/or the data requestor 560 in FIG. 10. The computer program 40 may be a part of an application that requires display of, for example, one or more objects on the display screen 26. The computer program 40, or another computer program contains or creates data structures which can be useful for storing data in computer memory to define images and instructions so that the computer graphics software may alter the images in response to inputs via the peripherals. For example, the software application may be a computer game that displays objects that form a scene for the user to interact with according to the game, in a manner where a user input produces a dynamic response to the displayed objects and thus the scene.

The invention should find application where trees represent hierarchical data and storing data in a tree structure is efficiently searchable, or for sorting lists of data. Such applications may include, but are not limited to bioinformatics (including searching and mining collections of DNA, gene, and amino acid sequences); software repositories (including handling and managing large numbers of versions, packages, modules, routines, etc.); and chemoinformatics (including databases storing sets of complex molecules).

Figures 3A, 3B:
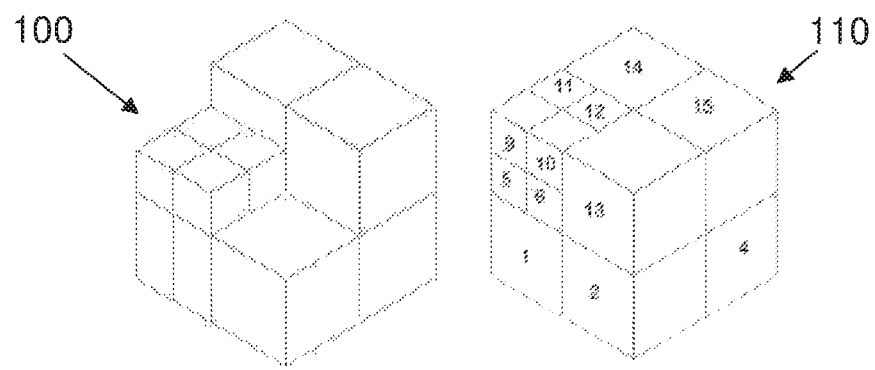
FIG. 3A illustrates a graphical structure.
FIG. 3B illustrates an octant data format for defining the graphical structure of FIG. 3A.
Figure 4:
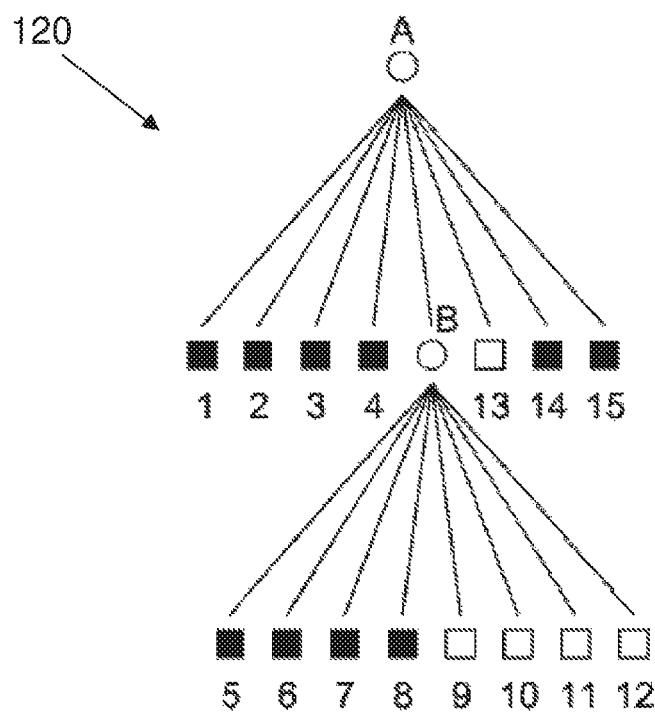
FIG. 4 illustrates a standard octree structure format for holding data representing the graphical structure of FIG. 3A.

The data structure of an octree is well known in the art as a three-dimensional representation of a region. FIG. 3A shows a 3-dimensional object 100 which has been decomposed into its octree block decomposition at 110 of FIG. 3B. FIG. 4 shows the octree block decomposition in a tree representation 120, where the parent node is at A, which is then subdivided into eight octants, one of which has a child sub-node at B, which may also become a parent node by subdivision into eight octants itself. In FIG. 4 the nodes simply indicate whether the part of the object they represent are filled or not. This is simply a binary (filled square or empty square) datum for each node. However each node can contain significantly more data, such as for example the intensity of each of three colours (red, green, blue) to indicate, for example a pixel colour. Hence data trees can contain multi-dimensional data, which in non-trivial cases can consume vast amounts of memory depending on the size of the tree (number and depth of the nodes), the number dimensions of the data in each node and the precision of each datum in each dimension in each node.

Where the data tree holds image data of a scene, an octree can be used. In the software application, be it a computer game or not, the software application may need to view a frustum of a scene held as data in an octree format so as to look into certain parts of the octree according to whether the scene to be displayed is in the frustum or not. Hence there is a need to access some of the data in the octree.

In FIG. 5 that the data tree represented in FIG. 4 is shown as 220 with non-trivial data of at least two dimensions. For convenience only one of each type of node are described, namely nodes A, 1, B and 8. Also child nodes with no data (nodes 13, 9, 10, 11 and 12) are removed.

Each node has at least two types of data associated with it; the data contained in the node, represented generically as D*D*, and data about the structure of the tree from the point of view of that node, represented generically as C*C*. Node A is shallowest in depth and includes data 222, that is, "CaCaDaDa", where DaDa is the data held by that node and CaCa is structural data in the form of information 224 about its children nodes, that is, "11111011". Each "1" indicates a child node is present, and each "0" indicates the child node is absent. Thus the "0" indicates its sixth child node, node 13, is absent. Node 1 is at a depth of one in the tree and its presence is indicated by the first of the "1"s in structure data 224. Node 1 includes data 240, that is, "C1D1D1D1", wherein D1D1D1 is the data held by that node and C1 is information 242 about its children nodes, that is, "00000000", indicating it has no child nodes. Node B is also at a depth of one in the tree. Node B includes data 244, that is, "CbCbCbDbDbDb", where DbDbDb is the data held by that node and CbCbCb is information 246 about its children nodes, that is, "11110000". This means that the first four of its child nodes are present (as nodes 5, 6, 7 and 8) and the second four of its child nodes are absent. Node 8 has a depth of two in the tree and it includes data 270, that is, "C8D8D8", where D8D8 is the data held by that node and C8 is information 272 about its children nodes, that is, "00000000", also indicating it has no child nodes. Nodes 2, 3, 4, 5, 6, 7, 14 and 15 all have data of the types described above, but the nature of that data is irrelevant to this example, aside from them not having further child nodes.

It is noted that the nodes are labelled in this example with a letter according to increasing depth for nodes with children and numbers in increasing node then depth order for nodes without children.

In an embodiment, in order to store the data tree in an efficient manner, the data structure of the tree 220 is encoded via a succinct data structure method. This is implemented by taking a representation of the data structure in a bit vector format. Notionally this is conducted by preparing a Depth-First Unary Degree Sequence (DFUDS) (described in Grossi, R, Ottaviano, G., *Design of Practical Succinct Data Structures for Large Data Collections,* 12th International Symposium, S E A 2013, Rome, Italy, Jun. 5-7, 2013, the contents of which are incorporated herein by reference) so that, in this example, the structure of the tree data takes on the form shown by 260 in FIG. 5. This representation uses parentheses 260 for ease of human perception, but would typically be represented as bits 280 in a computer, where each open bracket is a "1" and each closed bracket is a "0".

A DFUDS representation of the tree structure is created by concatenating in depth-first order the node sequence encoded in unary, that is, the degree d is encoded as $(^d)$. DFUDS prepends an initial open bracket onto the encoded data, so that the obtained sequence of parentheses 260 is balanced. Again, in the computer bits are used instead of parentheses. This encoding only requires 2 bits per node. The DFUDS representation only stores the ordering of the nodes in each branch of the tree, not the actual positions of the children of the parent nodes. Thus 282 indicates the order of the nodes by label and 284 indicates the order of the nodes by sequence beginning at 0. This is equivalent to the sequence number equal to Rank0 of that node. The representation can thus indicate the P node in the tree structure.

This bit vector representation of the tree structure can be used to determine various types of information about a given node according to the bit (or parenthesis if viewed by a view by a human) encoding. For example, the depth of a node can be determined, the parent of a node can be found or the $i^{th}$ child of a node can be found. These operations are described in Arroyuelo, D., Canovas, R., Novarro, G. and Sadakane, K, *Succinct Trees in Practice* (available from http://www.(dot)dcc.(dot)uchile.(dot)cl/~gnavarro/ps/alenex10.(dot)pdf), the contents of which is incorporated herein by reference.

Whilst the literature suggests the bit vector representation is enough to store the structure of the tree, the inventor has determined that this encoding of the structure of the tree is not enough because the presence position-wise of each child node is not part of the bit vector representation. Additional structural information about the tree is required, namely a position-wise indication of whether a given node has each child present or not, to fully understand the relative position in the hierarchy of the node. The relative position is important when the position maps to for example a three dimensional objection, such as that shown in FIG. 3B.

This child presence information can be included in the data represented by C*C* along with the data of each node. In other words, each node has information about its children in it, which can be used to map to the child node's depth when the depth of the current node is known, along with the relative position in the tree according to its sequence number. In an alternative, other information, such as for example the depth of the node can be encoded in the node's data C*C*. It is noted that C*C* is the compressed form of this data.

Each node can then have its original data compressed into a data portion using statistical encoding and which is represented generally as C*C*D*D*, and which will be of variable length due to the nature of statistical compression, such as Huffman coding. The data portions can be strung together to form a data stream 290 for storing in a storage medium, such as for example hard disk drive 16, or cloud based storage in the Internet 34. The lengths of the compressed data portions are known and these can be incrementally summed in sequence order as indicated by 292. These incrementing sums represent the position of each node in sequence order (represented by 284 and as represented by 280 in an encoded form) in the data stream 290. Thus, the incrementing sums 292 map the node sequence number 284 to the position of each data portion in the data stream 290.

In a preferred embodiment, the incrementing sums 292 is encoded using an Elias-Fano representation of monotone sequences (refer to Grossi et al, supra). Using this technique, the sequence of integers 292 is converted into bit vectors and each bit vector has the sequence of 1s encoded.

Thus the node's sequence number 284 is mapped to the bit position 292 of its associated data in the compressed stream 290. The mapping provides an efficient compressed alternative to the use of standard pointers.

Figure 8:
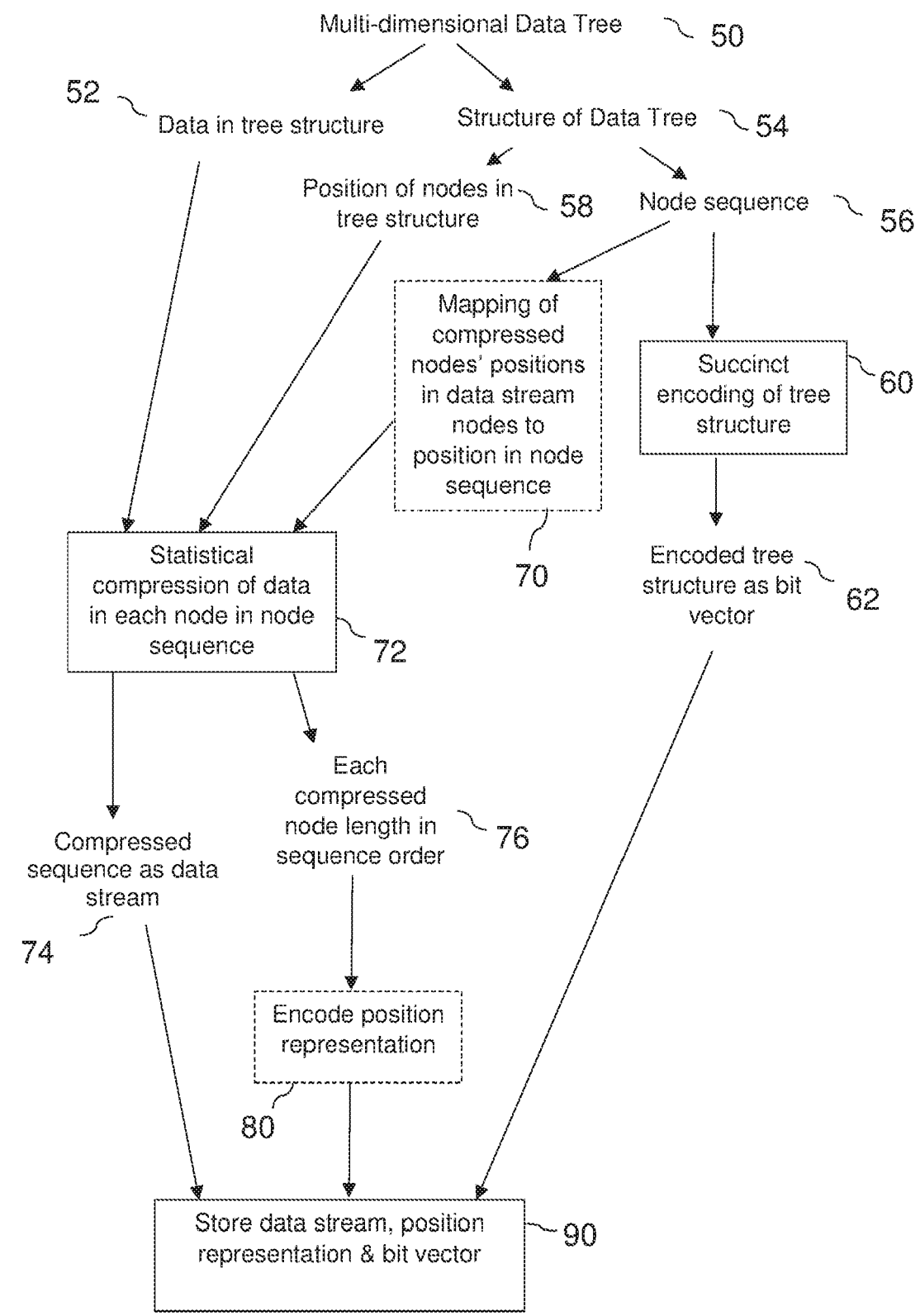
FIG. 8 illustrates a flow chart of the method of storing multi-dimensional data according to an embodiment of the present invention.

FIG. 8 provides a flowchart which diagrammatically shows an example process involved in storing multi-dimensional data according to an embodiment of the present invention. The process starts with a given node (which can be the first node in the tree, or another node within the tree structure). Tree data 50 associated with the given node comprises data held by the tree 52 including data in the given node and data representing the structure of the data tree 54. In an embodiment, the data representing the structure of the data tree 54 comprises information 58 representing whether the node comprises child nodes. In an embodiment, the data representing the structure of the data tree 54 comprises a bit position for each possible child node and the bit value represents whether the child node exists or not. In an embodiment, the tree is an octree and there are 8 bits representing whether or not the node has a child node for each of the corresponding bits.

In an embodiment, the data representing the structure of the data tree 54 comprises node sequencing information 56. In an embodiment the sequencing information 56 is encoded 60 via a succinct data structure encoding method (preferably DFUDS in this embodiment) so as to produce an encoded tree structure in the form of a bit vector 62. The bit vector may be the example 280 of FIG. 6.

The data in the data tree 52 and the positional information (information representing whether each node comprises child nodes) 58 is mapped 70 to the node sequence 56 by performing compression 72 on a node-by-node basis in node order (according to the node sequence 56). The data in the data tree 52 and the positional information 58 is compressed using Huffman coding or other suitable statistical/entropic compression encoding methods, depending on the type of data being stored. For example, nodes with high data content may be better stored using an arithmetic compression method. The resulting compressed data, while efficient is typically variable in compressed length. Each node's compressed data is concatenated in sequence order to form the data stream 74. The data stream may be for example 290 of FIG. 7. As each compressed data portion is produced, its compressed size (length in bits) is determined and the length in bits is used to form a representation 76 of the position of the data portions in the data stream 74. This representation may be for example 292 in FIG. 7. Because the compressed data portions are in node sequence order and the node sequence is encoded as a bit vector 62 there is a mapping of the position of each data position in the data stream 74 to the node sequence number. Thus, the position of each data portion in the data stream is able to be determined. In an embodiment, the position representation is encoded 80, preferably using the Elias-Fano representation. The data stream 74 and encoded position representation 80 and the sequence representation (in the form of the bit vector) 62 can then be stored 90. The stored data 90 is able to provide the original tree data 50 in a compressed sequence form, which enables the node and child positions within the tree structure to be accessed for retrieval, without decompression of the entire tree structure.

In an embodiment, forming the compressed data stream at 74 comprises adding the compressed data portion to the end of the existing data stream. In an embodiment, forming the position representation comprises decoding the current encoded position representation, if necessary, adding the length in bits of the compressed data position to the end of the existing position representation, and if necessary encoding the position representation. In an embodiment, forming the bit vector comprises encoding the node sequence in depth-first order. Each node can be progressively stored in this manner until the whole tree is stored.

Figure 9:
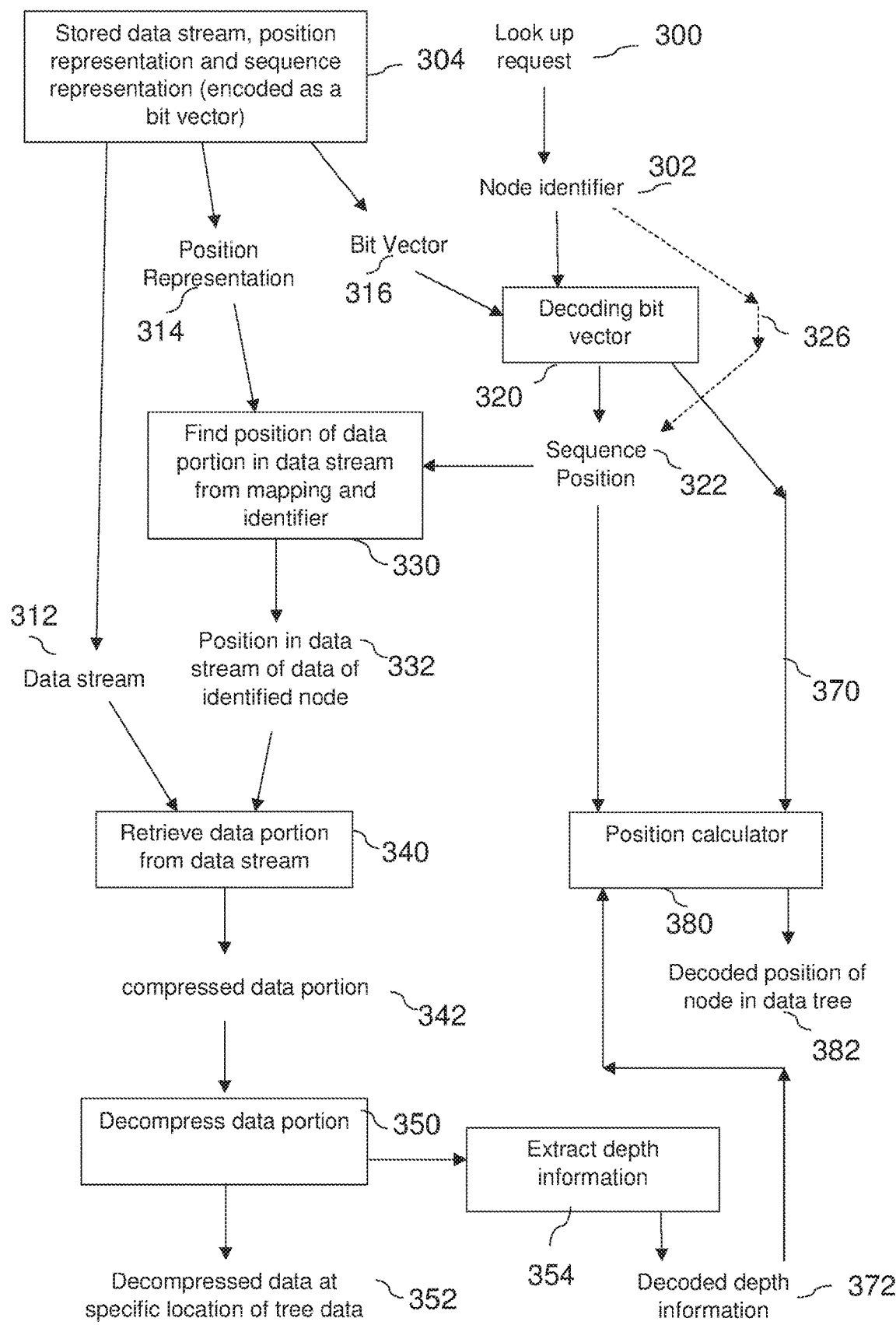
FIG. 9 illustrates a flow chart of the method of retrieving multi-dimensional data according to an embodiment of the present invention.

FIG. 9 provides a flow chart, which diagrammatically shows the process involved in retrieving multi-dimensional data according to an embodiment of the present invention. A lookup request 300 comprising a node identifier 302 triggers the retrieval process. The node identifier 302 may be the node sequence number in the tree. The sequence number may be obtained when the subject node is a child node and the parent node of the subject node has previously been retrieved thereby identifying the sequence number. Otherwise, the node identifier may be the first node in the tree. The node identifier could take another form, such as "the parent of the current node", or "the P child of the current node". The node identifier 302 may be generated by the techniques described in Arroyuelo et al, supra.

The data tree is stored 304 in the form of a stored data stream 312, a position representation 314 and a sequence representation (encoded as a bit vector) 316. For example, the stored data stream may be illustrated by 290 of FIG. 7. The stored position representation by be illustrated by 292 of FIG. 7 and the stored sequence representation may be illustrated by 280 of FIG. 6. Depending on the form of the node identifier 302, the sequence representation 316 may be decoded 320 from bit vector form to identify the sequence position 322 of the node. The node identifier may already be the sequence position of the node as indicated by 326. If the position representation 314 is encoded, (such as an Elias-Fano representation of monotone sequences), then it will be decoded. The sequence position 322 is used to identify 330 where within the (decoded) position representation 314 the position 332 of identified node's data portion is stored in the data stream 312. The data portion identified by its position 332 is then retrieved 340 from the data stream 312. The data portion is in compressed form 342. The compressed data portion 342 is then decompressed 350 to produce the decompressed data 352 of the identified node. Further, the compressed node position information is also decompressed to provide its depth information 372 (and in the embodiment described above is in the form of information on whether it has child nodes, which together with other information can provide its depth position). The other information may be for example a current node's depth position.

The sequence position 322 of the current node together with the bit vector 316 and the depth information (the presence of child nodes) can be used to calculate 380 the decoded position of the node in the data tree 382 and/or the position of a child node in the data tree. Once the data 352 is decoded, it can be returned. Further depth information 372 and/or position information 382 can be used in relation to the data 352 or can be used as, and/or in relation to, a node identifier for looking up another node.

In the present invention, the method of storing and retrieving multi-dimensional data is different from known techniques, in that the storage of the multi-dimensional data is performed after the nodes of the tree data structure have been mapped to a corresponding bit position in the compressed data portion. This enables only the desired node to be decompressed and retrieved via decoding instead of decompressing and decoding the entire tree structure, as would occur in the standard manner of performing storage and retrieval.

Figure 10:
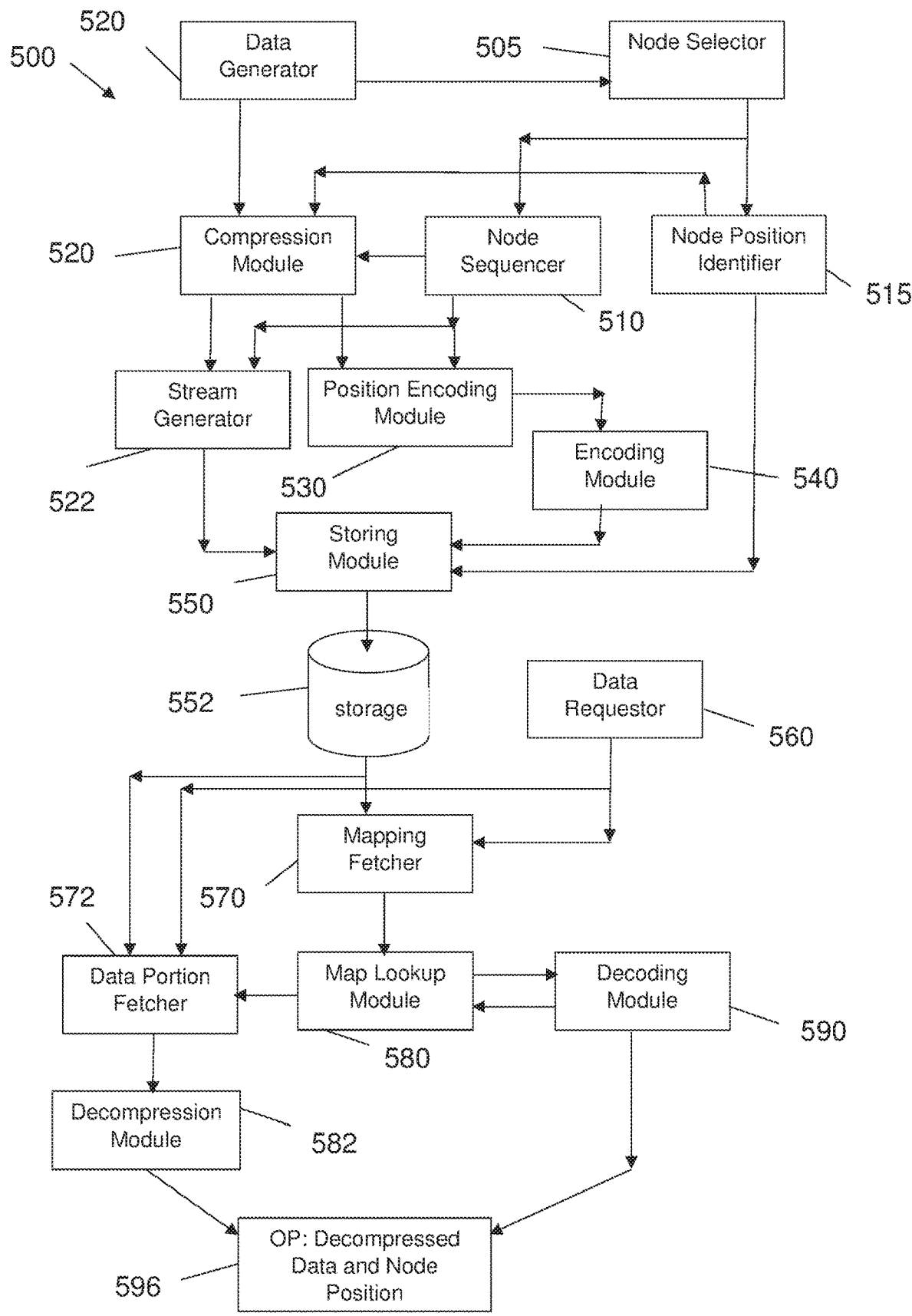
FIG. 10 shows a block diagram of modules of an embodiment of a system according to the present invention.

FIG. 10 illustrates in module format, an embodiment 500 in which the system 10 may be configured to perform the methods described above. A data generator 520 generates multidimensional data for storage in a data tree form. Typically, this will be in octree form. Typically, there are vast amounts of data generated. Each multidimensional datum is able to be stored in the data tree either individually or collectively according to the sequential or otherwise selection of a node by node selector 505. Here the memory 20 is configured to operate as a stack in which node data, structure information or position information is stacked in relation to storing of nodes or accessing of stored nodes.

The node selector 505 interfaces with a node sequencer 510 to determine the sequential position of the subject node or each node in the data tree. The node selector 505 interfaces with a node position identifier 515 to determine the depth position of the node in the data tree. In an embodiment, the depth position comprises information about the presence and position of child nodes from the subject node.

The compression module 520 compresses the data from the data generator 520 and the depth position information from the node position identifier 515. The compression module 520 provides the compressed data to the stream generator 520. The node sequencer 510 provides the sequence position of the node to the stream generator 520, such that the stream is generated in the correct sequence of data portions. The data stream is stored by the storage module 550 in a storage medium 552.

The encoding module 540 encodes the node position into a bit vector. The encoding module also encodes the position of each data portion in the data stream as a position representation. The sequence representation will be mapped to the position representation because these are in node sequence order. These representations are also referred to as the mapping and are stored by the storage module 550 in the storage medium 552.

A data requestor 560 creates a request for the retrieval of data from the data tree stored in storage 552. The data requestor 560 may be an element of the computer program 40. The data requestor 560 causes a mapping fetcher 570 to access the storage 552 and retrieve the mapping of the positions of the compressed data portions in the data stream with identifiers of the nodes. As noted above the mapping comprises the sequence representation and the position representation. A map lookup module 580 obtains the sequence representation (which in an embodiment is a bit vector as noted above) to determine the sequence of stored nodes. The data request 560 will identify the node to be retrieved (as node identifier 302 in the embodiment of FIG. 9), such as in the form of its sequence number, but it may in another form, such as "the child of a certain node" or "the next node in the sequence from the current node". The sequence representation is provided to a decoding module 590 to decode the bit vector into a sequence number which is returned to the map lookup module 580. The position representation may also be decoded from the Elias-Fano representation by the module 580 or the module 590 or a separate module. The map lookup module 580 uses the sequence number of the node to be retrieved is used to look up a position from the (decoded) position representation. The position is provided to a data portion fetcher 572. The data portion fetcher 572 retrieves the compressed data portion from the storage 552 according to the looked up position of the data portion. A decompression module 582 decompresses the data portion to provide the decompressed data of the identified node and depth information about the node to an output 596. The decoding module 590 also provides the sequence position of the identified node in the tree structure. This is provided to the output 596. The position in combination with the decompressed depth information allows the position of the identified node in the data tree to be determined or one or more next (child) nodes.

The invention advantageously provides a method of storing and retrieving tree data via succinct data structures and bit mapping, to achieve efficient storage and subsequent retrieval of the data. In particular, the retrieval of the data achieves efficiency through decompressing only the discrete portion of the data that is required, without decompressing the entire tree data structure as would traditionally be required. This results in a quicker and more efficient manner of retrieving the data from its stored location.

Modifications may be made to the present invention within the context of that described and shown in the drawings. Such modifications are intended to form part of the invention described in this specification.

The invention claimed is:

1. A method of storing multi-dimensional data, the method comprising:
    encoding a structure of nodes of a tree data structure into an order representation;
    compressing data of nodes of the tree data structure to create a data stream of compressed data portions of variable length in a sequence corresponding to the order represented in the order representation, wherein each compressed data portion is formed from the data of each node;
    mapping the positions of the data portions in the data stream to the order representation to produce a location representation;
    storing the order representation, data stream and location representation;
    decompressing data of an identified node without decompressing the entirety of the stored data stream.

2. A method according to claim 1, wherein the location representation is encoded for storing.

3. A method according to claim 1, wherein the data portions comprise node structural information.

4. A method according to claim 3, wherein the node structural information in the created data portions comprise the presence or absence of child nodes to that node.

5. A method according to claim 1, wherein the order representation is in the form of a bit vector.

6. A method according to claim 5, wherein the bit vector is encoded using a succinct data structure technique.

7. A method according to claim 6, wherein the succinct data structure technique for encoding the ordering of nodes is a depth-first unary degree sequence succinct data structure technique.

8. A method according to claim 7, wherein the depth-first unary degree sequence succinct data structure technique comprises concatenating in depth-first order the tree data structure using a balanced bit representation, wherein the balanced bit representation forms the bit vector.

9. A method according to claim 5, wherein the position of the node in the bit vector is mapped to the position of the data portion in the data stream.

10. A method according to claim 9, wherein the mapping of the data portions in the data stream comprises determining the position in the data stream of the location of each data portion.

11. A method according to claim 10, wherein each location is determined as the position in the data stream of the beginning of the respective data portion.

12. A method according to claim 11, wherein the locations of the positions of the node are encoded in node order as the location representation.

13. A method of retrieving multi-dimensional data, the method comprising:
    receiving an identifier of a node of tree data to be retrieved;
    providing a stored data tree comprising a data stream of a plurality of data portions, where each data portion is of a variable size and comprises compressed data of a node of the data tree; providing a data order representation of a sequence of nodes in the stored data tree;
    providing a location representation which represents the position of the variable length data portions in the data stream in sequence order;

decoding bit vector data order representation to identify a sequence position of the identified node in the sequence of data portions in the data stream;

determining the location in the data stream of the identified node from the decoded position in the sequence and the location representation;

accessing the data portion at the determined location within the data stream;

decompressing the accessed data portion to obtain decompressed data of the identified node, wherein the decompression of the data of the identified node occurs without decompressing the entirety of the data stream.

14. A method of retrieving multi-dimensional data, the method comprising:

receiving an identifier of a node of tree data structure to be retrieved;

decoding a data order representation to identify a sequence position of the identified node in a sequence of data portions in a data stream of data portions, each data portion being compressed node data;

determining a location in the data stream of the identified node from the decoded position in the sequence and a location representation which represents the position of the variable length data portions in the data stream in sequence order;

accessing the data portion at the determined location within the data stream;

decompressing the accessed data portion to obtain decompressed data of the identified node;

wherein the decompression of the data of the identified node occurs without decompressing the entirety of the data stream.

15. A method according to claim 14, wherein the data order representation is in the form of a bit vector.

16. A method according to claim 14, wherein the decompression of the data is performed on discrete locations within the data stream.

17. A method according to claim 14, wherein the method further comprises decoding the location representation to produce the positions of the variable length data portions in the data stream.

18. A method according to claim 17, wherein the decoding comprises retrieving a first bit sequence and a second bit sequence according to the identifier and concatenating the first and second bit sequences to form the data order representation, which represents the respective position of the variable length data position of the identified node.

19. A method according to claim 17, wherein the decoding comprises reversing an Elias-Fano representation of monotone sequences of the location representation.

20. A method according to claim 14, wherein the method further comprises extracting child node information from the decompressed data portion.

21. A method according to claim 20, wherein the method further comprises combining the extracted child node information with the sequence order of the nodes to determine the position of child nodes of the decompressed node in the data tree structure.

22. A method according to claim 21, wherein the presence of child nodes of the decompressed node is determined from child node information.

23. A method according to claim 22, wherein the sequence of child nodes corresponds to the order of nodes represented in the data order representation.

24. A method according to claim 23, wherein the position of a child node in the tree structure forms an identifier of a further node to be retrieved.

25. A method according to claim 14, wherein the method further comprises combining node positon information in the decompressed data portion with the identified sequence positon of the node to determine the position of the decompressed data in the data tree structure.

* * * * *